United States Patent
Tsai et al.

(10) Patent No.: US 10,354,982 B2
(45) Date of Patent: *Jul. 16, 2019

(54) INTEGRATED FAN-OUT STRUCTURE WITH GUIDING TRENCHES IN BUFFER LAYER

(71) Applicant: Taiwan Semiconductor Manufacturing Company, Ltd., Hsinchu (TW)

(72) Inventors: Po-Hao Tsai, Zhongli (TW); Feng-Cheng Hsu, New Taipei (TW); Li-Hui Cheng, New Taipei (TW); Jui-Pin Hung, Hsinchu (TW); Jing-Cheng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/002,791

(22) Filed: Jun. 7, 2018

(65) Prior Publication Data

US 2018/0286839 A1  Oct. 4, 2018

Related U.S. Application Data

(60) Continuation of application No. 15/495,017, filed on Apr. 24, 2017, now Pat. No. 10,083,946, which is a (Continued)

(51) Int. Cl.
*H01L 25/10* (2006.01)
*H01L 21/56* (2006.01)
(Continued)

(52) U.S. Cl.
CPC .......... *H01L 25/105* (2013.01); *H01L 21/563* (2013.01); *H01L 21/565* (2013.01); *H01L 21/568* (2013.01); *H01L 21/6835* (2013.01); *H01L 21/6836* (2013.01); *H01L 21/7682* (2013.01); *H01L 21/76802* (2013.01); *H01L 21/8221* (2013.01); *H01L 23/31* (2013.01); *H01L 23/315* (2013.01);
(Continued)

(58) Field of Classification Search
CPC ..... H01L 25/105; H01L 25/117; H01L 23/31; H01L 21/7682; H01L 21/76802; H01L 21/565; H01L 21/8221; H01L 2924/1815
See application file for complete search history.

(56) References Cited

U.S. PATENT DOCUMENTS 5,255,431 A  10/1993  Burdick
5,494,862 A  2/1996  Kato et al.
(Continued)

FOREIGN PATENT DOCUMENTS

| DE | 102006010511 A1 | 9/2007 |
| KR | 101177664 B1 | 8/2012 |
| KR | 1020130085821 A | 7/2013 |

*Primary Examiner* — Joseph C. Nicely
(74) *Attorney, Agent, or Firm* — Slater Matsil, LLP

(57) ABSTRACT

A bottom package includes a molding compound, a buffer layer over and contacting the molding compound, and a through-via penetrating through the molding compound. A device die is molded in the molding compound. A guiding trench extends from a top surface of the buffer layer into the butter layer, wherein the guiding trench is misaligned with the device die.

20 Claims, 15 Drawing Sheets

Related U.S. Application Data continuation of application No. 15/215,195, filed on Jul. 20, 2016, now Pat. No. 9,633,895, which is a division of application No. 14/024,311, filed on Sep. 11, 2013, now Pat. No. 9,425,121.

(51) Int. Cl.

| | | |
|---|---|---|
| *H01L 23/31* | (2006.01) | |
| *H01L 21/768* | (2006.01) | |
| *H01L 21/822* | (2006.01) | |
| *H01L 23/00* | (2006.01) | |
| *H01L 21/683* | (2006.01) | |
| *H01L 25/065* | (2006.01) | |
| *H01L 25/00* | (2006.01) | |
| *H01L 25/11* | (2006.01) | |

(52) U.S. Cl.
CPC ...... *H01L 23/3114* (2013.01); *H01L 23/3128* (2013.01); *H01L 24/19* (2013.01); *H01L 24/97* (2013.01); *H01L 25/0657* (2013.01); *H01L 25/117* (2013.01); *H01L 25/50* (2013.01); H01L 21/561 (2013.01); H01L 24/73 (2013.01); H01L 2221/68327 (2013.01); H01L 2221/68372 (2013.01); H01L 2224/12105 (2013.01); H01L 2224/32145 (2013.01); H01L 2224/32225 (2013.01); H01L 2224/48091 (2013.01); H01L 2224/48227 (2013.01); H01L 2224/73265 (2013.01); H01L 2224/73267 (2013.01); H01L 2224/82 (2013.01); H01L 2224/83 (2013.01); H01L 2224/92244 (2013.01); H01L 2224/97 (2013.01); H01L 2225/0651 (2013.01); H01L 2225/06513 (2013.01); H01L 2225/06541 (2013.01); H01L 2225/06568 (2013.01); H01L 2225/1035 (2013.01); H01L 2225/1058 (2013.01); H01L 2225/1082 (2013.01); H01L 2924/12042 (2013.01); H01L 2924/15311 (2013.01); H01L 2924/181 (2013.01); H01L 2924/1815 (2013.01)

(56) References Cited

U.S. PATENT DOCUMENTS

| | | |
|---|---|---|
| 7,619,901 B2 | 11/2009 | Eichelberger et al. |
| 8,133,762 B2 | 3/2012 | Pagaila et al. |
| 8,237,060 B2 | 8/2012 | Tanaka |
| 8,829,686 B2 | 9/2014 | Hong et al. |
| 9,029,998 B2 | 5/2015 | Jang et al. |
| 9,048,222 B2 | 6/2015 | Hung et al. |
| 9,082,806 B2 | 7/2015 | Lin et al. |
| 9,425,121 B2 * | 8/2016 | Tsai ...................... H01L 21/563 |
| 9,633,895 B2 * | 4/2017 | Tsai ...................... H01L 21/563 |
| 10,083,946 B2 * | 9/2018 | Tsai ...................... H01L 21/563 |
| 2006/0099786 A1 | 5/2006 | Fan et al. |
| 2008/0316714 A1 | 12/2008 | Eichelberger et al. |
| 2009/0120680 A1 | 5/2009 | Tanno et al. |
| 2009/0244865 A1 | 10/2009 | Tanaka |
| 2010/0316878 A1 | 12/2010 | Naritomi et al. |
| 2011/0128711 A1 | 6/2011 | Yim et al. |
| 2011/0291218 A1 | 12/2011 | Yamamura et al. |
| 2012/0074586 A1 | 3/2012 | Seo et al. |
| 2012/0285924 A1 | 11/2012 | Lee et al. |
| 2013/0009308 A1 | 1/2013 | Kwon |
| 2013/0062760 A1 | 3/2013 | Hung et al. |
| 2013/0107482 A1 | 5/2013 | Inagaki et al. |
| 2013/0127054 A1 | 5/2013 | Muthukumar et al. |
| 2013/0187813 A1 | 7/2013 | Yao et al. |
| 2013/0299466 A1 | 11/2013 | Leu et al. |
| 2014/0048906 A1 | 2/2014 | Shim et al. |
| 2014/0110856 A1 | 4/2014 | Lin |
| 2014/0190728 A1 | 7/2014 | Chou et al. |
| 2014/0252646 A1 | 9/2014 | Hung et al. |
| 2014/0299356 A1 | 10/2014 | Zhang et al. |
| 2015/0069623 A1 | 3/2015 | Tsai et al. |
| 2015/0102502 A1 | 4/2015 | Chiu et al. |
| 2015/0103357 A1 | 4/2015 | Schmit et al. |
| 2015/0247808 A1 | 9/2015 | Van Der Wilt |
| 2015/0340329 A1 | 11/2015 | Yu |
| 2015/0348923 A1 | 12/2015 | Wang et al. |
| 2017/0250139 A1 | 8/2017 | Huang et al. |

\* cited by examiner

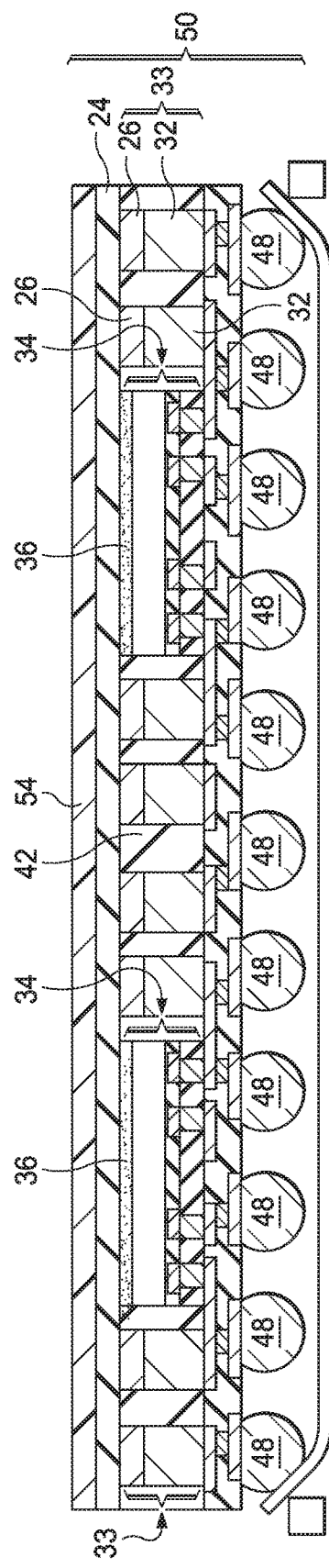
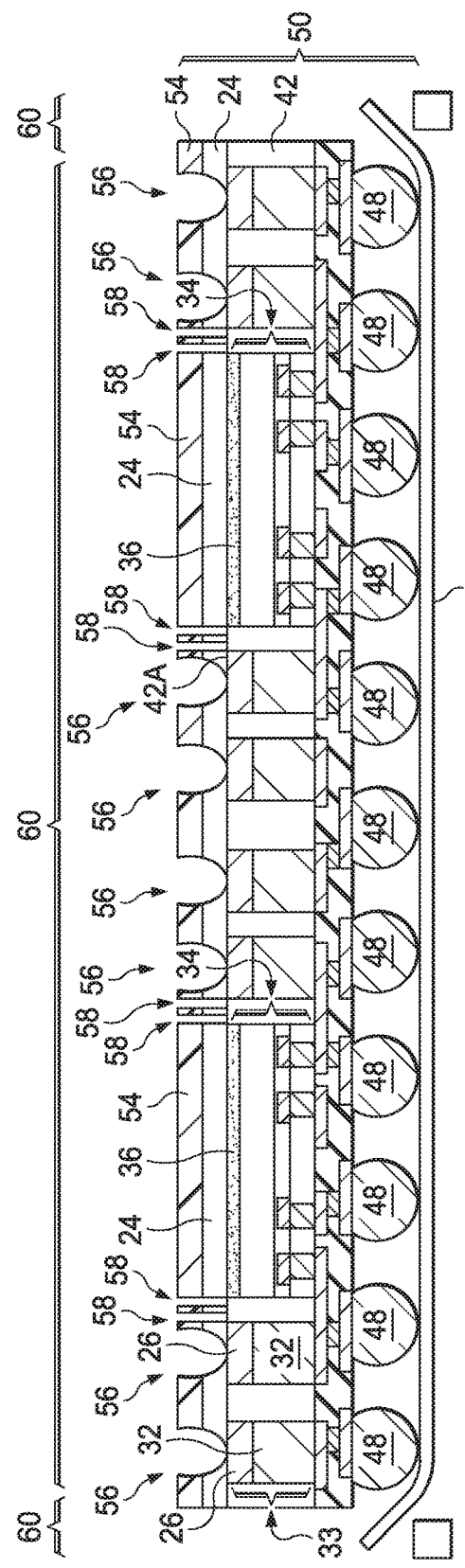
FIG. 12
FIG. 13

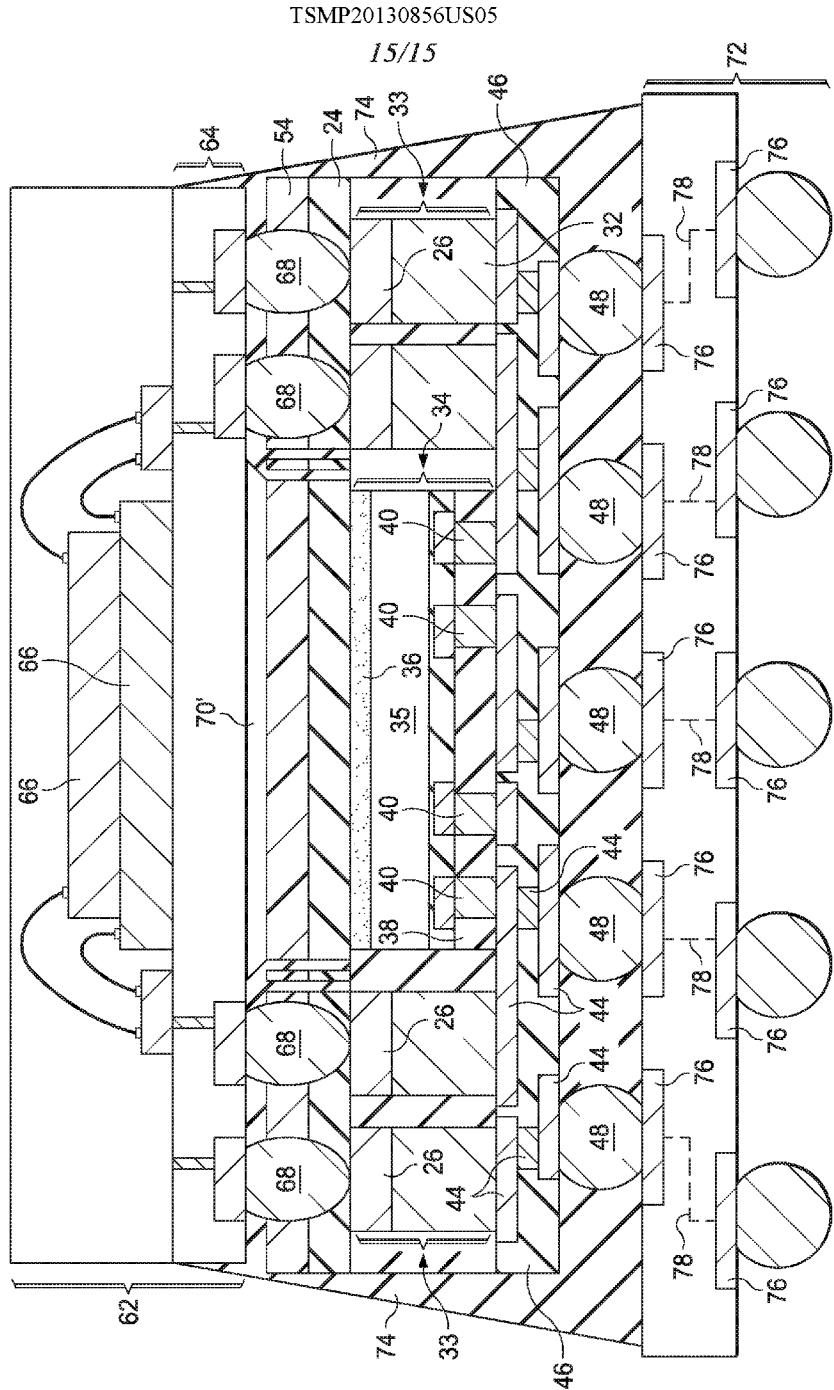

INTEGRATED FAN-OUT STRUCTURE WITH GUIDING TRENCHES IN BUFFER LAYER

PRIORITY CLAIM AND CROSS REFERENCE

This application is continuation of U.S. patent application Ser. No. 15/495,017, entitled "Integrated. Fan-Out Structure with Guiding Trenches in Buffer Layer," filed on Apr. 24, 2017, which is a continuation of U.S. patent application Ser. No. 15/215,195, entitled "Integrated Fan-Out Structure with Guiding Trenches in Buffer Layer," filed on Jul. 20, 2016, now U.S. Pat. No. 9,633,895 issued Apr. 25, 2017, which is a divisional of U.S. patent application Ser. No. 14/024,311, entitled "Integrated Fan-Out Structure with Guiding Trenches in Buffer Layer," filed on Sep. 11, 2013, now U.S. Pat. No. 9,425,121 issued Aug. 23, 2016, which applications are incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. As aforementioned, the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 13 are cross-sectional views of intermediate stages in the manufacturing of a Through Integrated fan-out Via (TIV) package in accordance with some exemplary embodiments;

FIG. 16 illustrates the dispensing of underfill into a gap between the TIV package and a top package in accordance with some alternative exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

An Integrated Fan-Out (InFO) package including through-vias and the methods of forming the same are provided in accordance with various exemplary embodiments. The intermediate stages of forming the InFO package are illustrated. The variations of the embodiments are discussed. Throughout the various views and illustrative embodiments, like reference numbers are used to designate like elements.

Figure 1:
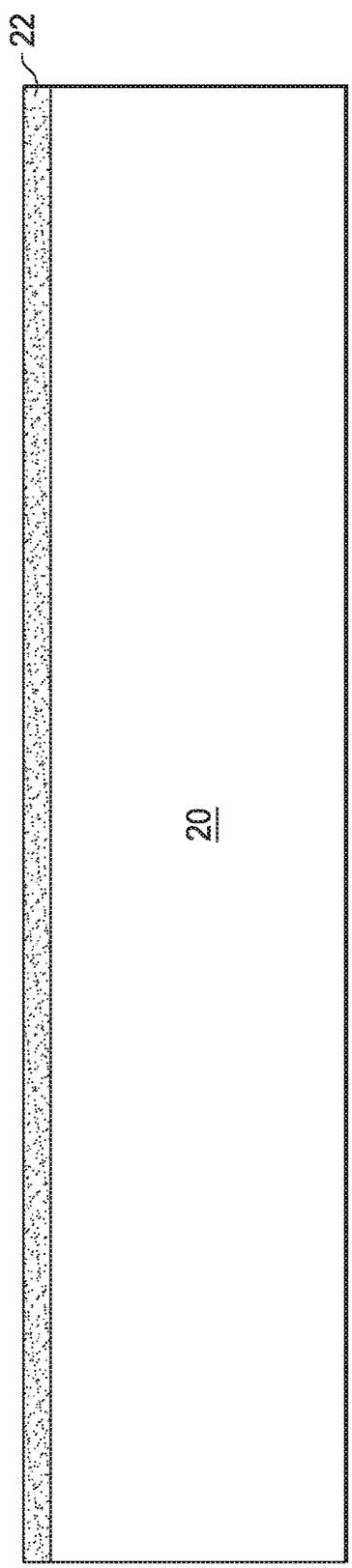

FIGS. 1 through 16 are cross-sectional views of intermediate stages in the manufacturing of a package structure in accordance with some exemplary embodiments. Referring to FIG. 1, carrier 20 is provided, and adhesive layer 22 is disposed on carrier 20. Carrier 20 may be a blank glass carrier, a blank ceramic carrier, or the like. Adhesive layer 22 may be formed of an adhesive such as a Ultra-Violet (UV) glue, Light-to-Heat Conversion (LTHC) glue, or the like, although other types of adhesives may be used.

Figure 2:
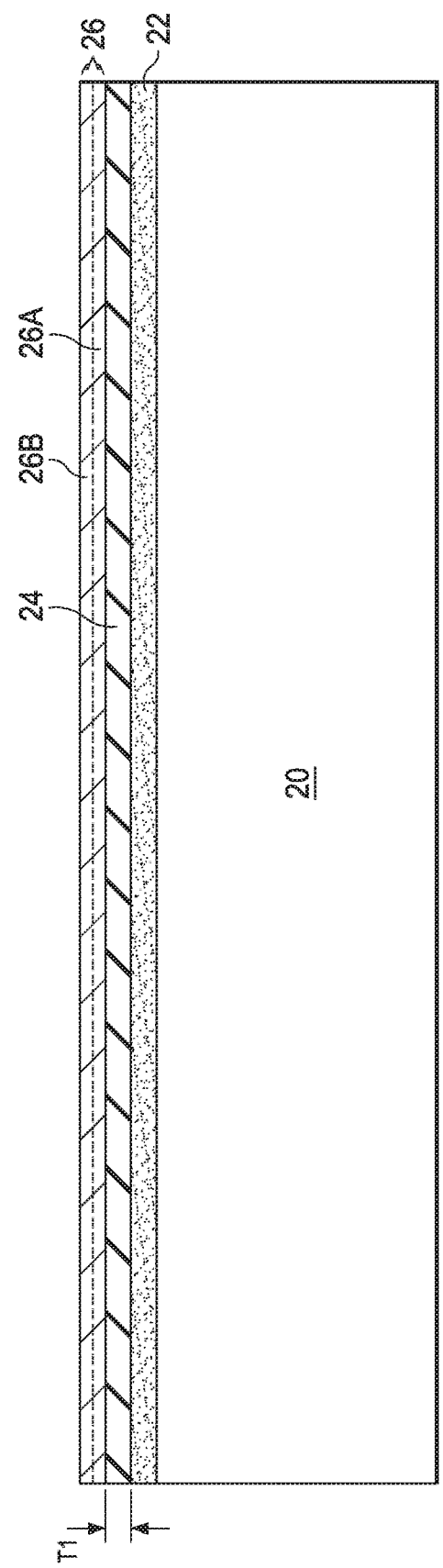

Referring to FIG. 2, buffer layer 24 is formed over adhesive layer 22. Buffer layer 24 is a dielectric layer, which may be a polymer layer comprising a polymer. The polymer may be, for example, polyimide, PolyBenzOxazole (PBO), BenzoCycloButene (BCB), Ajinomoto Buildup Film (ABF), Solder Resist film (SR), or the like. Buffer layer 24 is a planar layer having a uniform thickness, wherein the thickness T1 may be greater than about 2 µm, and may be between about 2 µm and about 40 µm. The top and the bottom surfaces of buffer layer 24 are also planar.

Seed layer 26 is formed on polymer layer 24, for example, through Physical Vapor Deposition (PVD) or metal foil laminating. Seed layer 26 may comprise copper, copper alloy, aluminum, titanium, titanium alloy, or combinations thereof. In some embodiments, seed layer 26 comprises titanium layer 26A and copper layer 26B over titanium layer 26A. In alternative embodiments, seed layer 26 is a copper layer.

Figure 3:
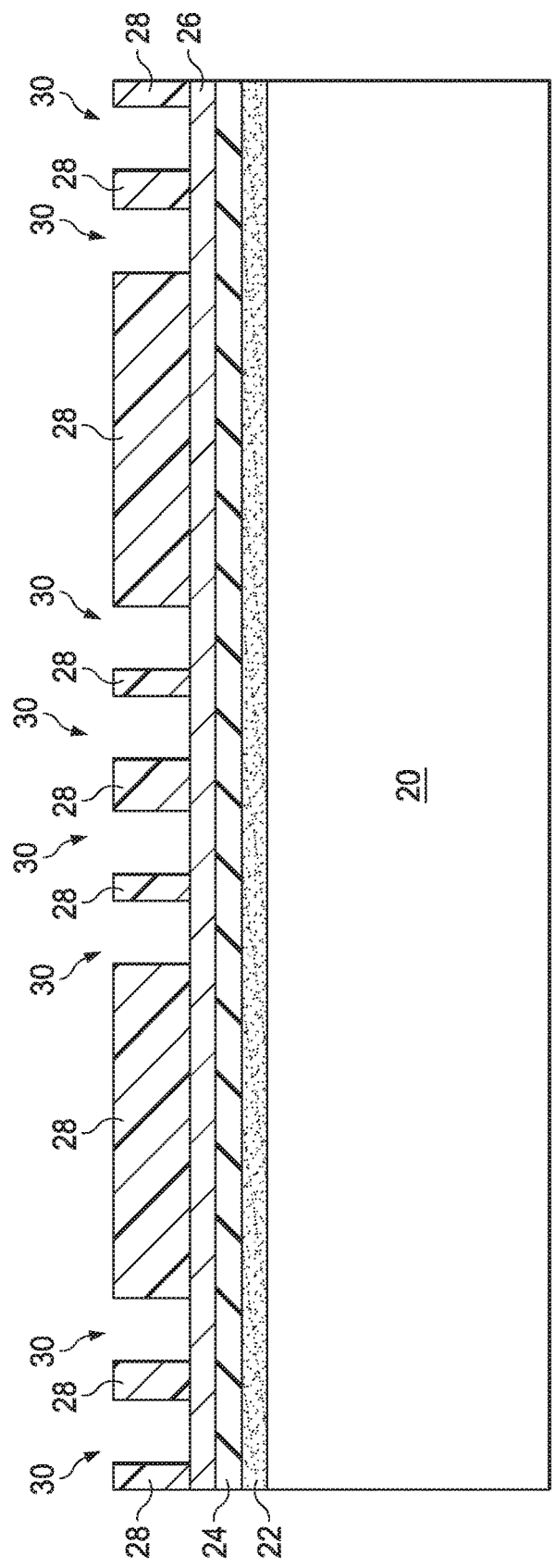

Referring to FIG. 3, photo resist 28 is applied over seed layer 26, and is then patterned. As a result, openings 30 are formed in photo resist 28, through which some portions of seed layer 26 are exposed.

Figure 4:
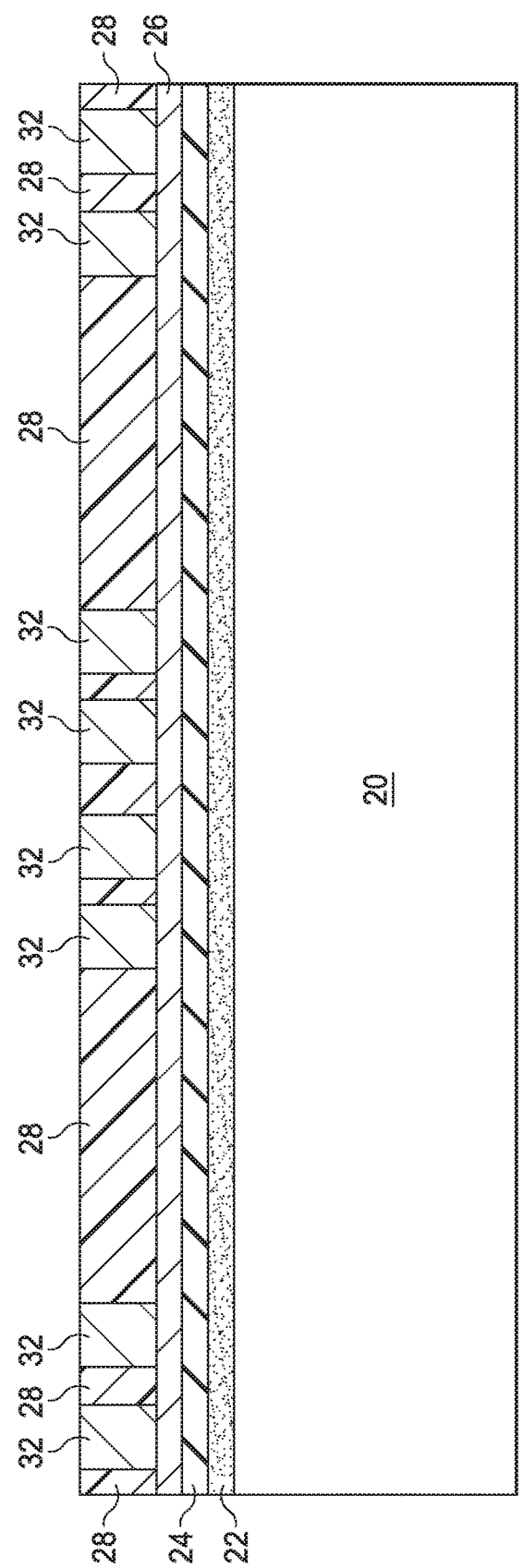
Figure 5:
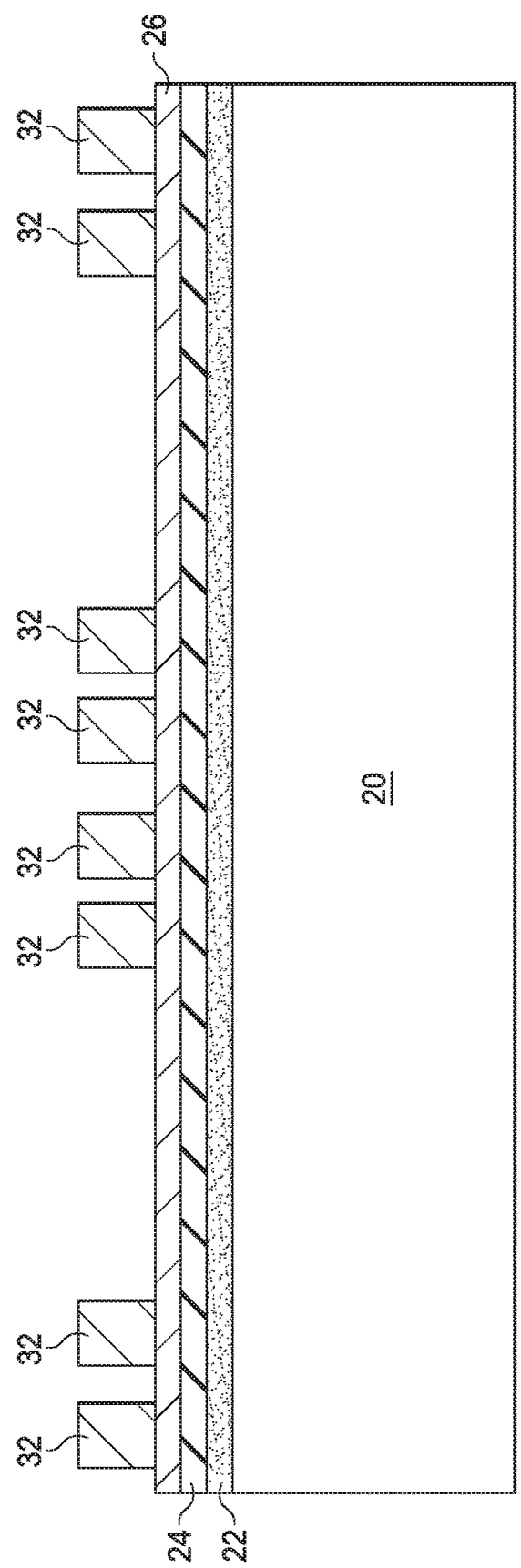

As shown in FIG. 4, metal features 32 are formed in photo resist 28 through plating, which may be electro plating or electro-less plating. Metal features 32 are plated on the exposed portions of seed layer 26. Metal features 32 may comprise copper, aluminum, tungsten, nickel, solder, or alloys thereof. The top-view shapes of metal features 32 may be rectangles, squares, circles, or the like. The heights of metal features 32 are determined by the thickness of the subsequently placed dies 34 (FIG. 7), with the heights of metal features 32 greater than the thickness of dies 34 in some embodiments. After the plating of metal features 32, photo resist 28 is removed, and the resulting structure is shown in FIG. 5. After photo resist 28 is removed, the portions of seed layer 26 that are covered by photo resist 28 are exposed.

Figure 6:
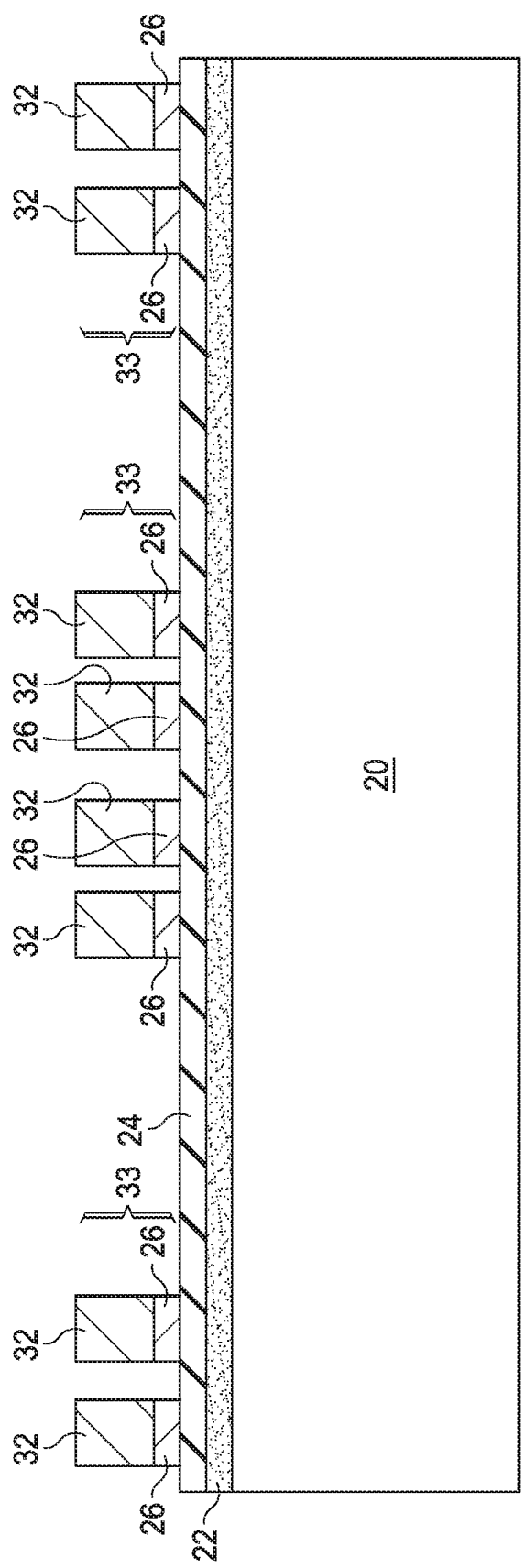

Referring to FIG. 6, an etch step is performed to remove the exposed portions of seed layer 26, wherein the etching may be an anisotropic etching. The portions of seed layer 26 that are overlapped by metal features 32, on the other hand, remain not etched. Throughout the description, metal features 32 and the remaining underlying portions of seed layer 26 are in combination referred to as Through InFO Vias (TiVs) 33, which are also referred to as through-vias 33. Although seed layer 26 is shown as a layer separate from metal features 32, when seed layer 26 is formed of a material similar to or the same as the respective overlying metal features 32, seed layer 26 may be merged with metal features 32 with no distinguishable interface therebetween. In alternative embodiments, there exist distinguishable interfaces between seed layer 26 and the overlying metal features 32.

Figure 7:
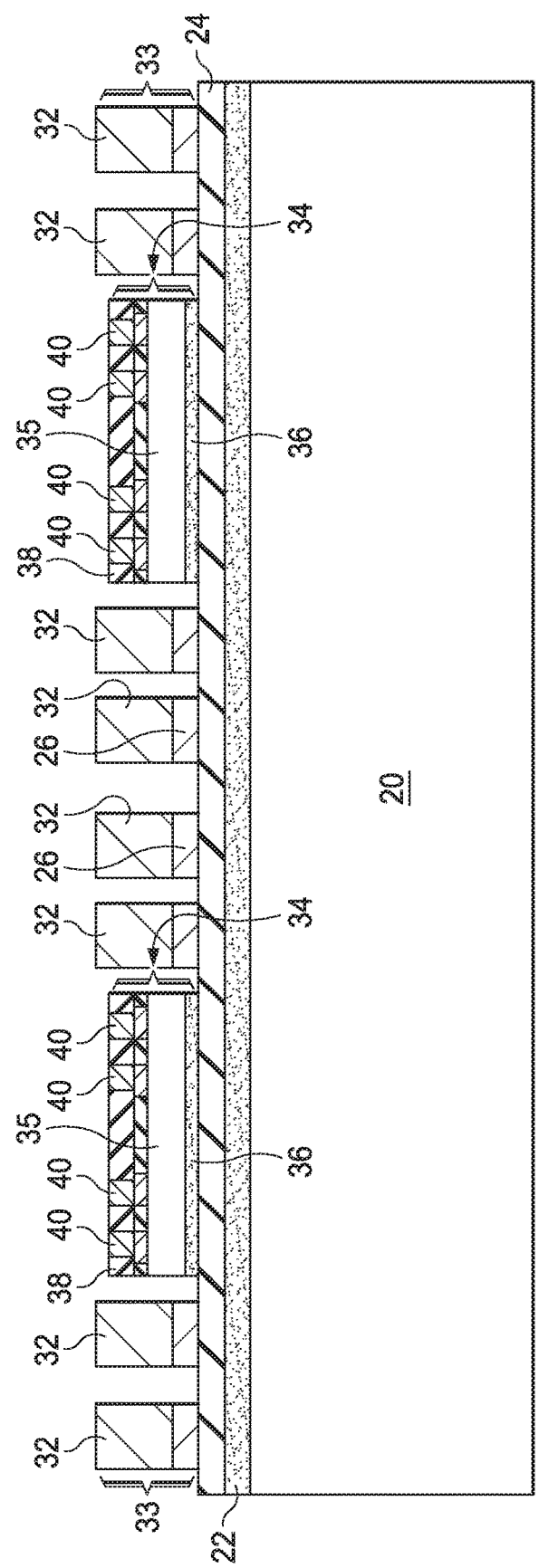

FIG. 7 illustrates the placement of device dies 34 over buffer layer 24. Device dies 34 may be adhered to buffer layer 24 through adhesive layer(s) 36. Device dies 34 may be logic device dies including logic transistors therein. In some exemplary embodiments, device dies 34 are designed for mobile applications, and may be Central Computing Unit (CPU) dies, Power Management Integrated Circuit (PMIC) dies, Transceiver (TRX) dies, or the like. Each of device dies 34 includes semiconductor substrate 35 (a silicon substrate, for example) that contacts adhesive layer 36, wherein the back surface of semiconductor substrate 35 is in contact with adhesive layer 36.

In some exemplary embodiments, metal pillars 40 (such as copper posts) are formed as the top portions of device dies 34, and are electrically coupled to the devices such as transistors (not shown) in device dies 34. In some embodiments, dielectric layer 38 is formed at the top surface of the respective device die 34, with metal pillars 40 having at least lower portions in dielectric layer 38. The top surfaces of metal pillars 40 may also be level with the top surfaces of metal pillars 40 in some embodiments. Alternatively, dielectric layers 38 are not formed, and metal pillars 40 protrude above a top dielectric layer of the respective device dies 34.

Figure 8:
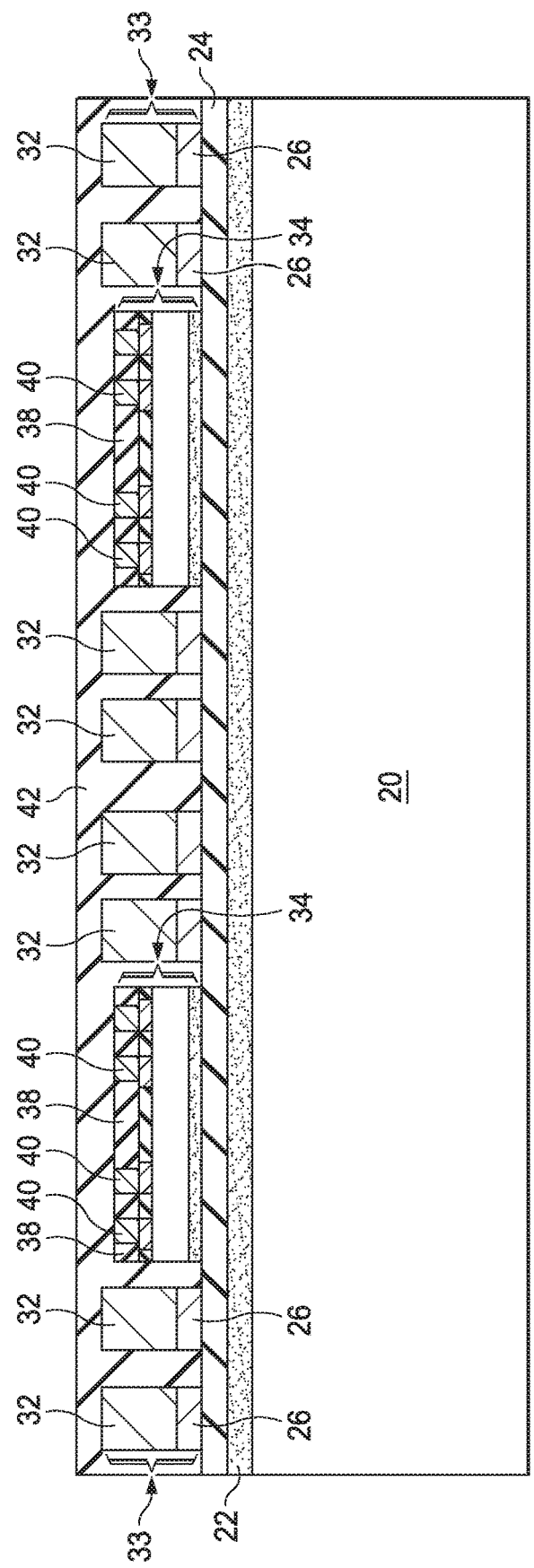

Referring to FIG. 8, molding material 42 is molded on device dies 34 and TIVs 33. Molding material 42 fills the gaps between device dies 34 and TIVs 33, and may be in contact with buffer layer 24. Furthermore, molding material 42 is filled into the gaps between metal pillars 40 when metal pillars 40 are protruding metal pillars. Molding material 42 may include a molding compound, a molding underfill, an epoxy, or a resin. The top surface of molding material 42 is higher than the top ends of metal pillars 40 and TIVs 33.

Figure 9:
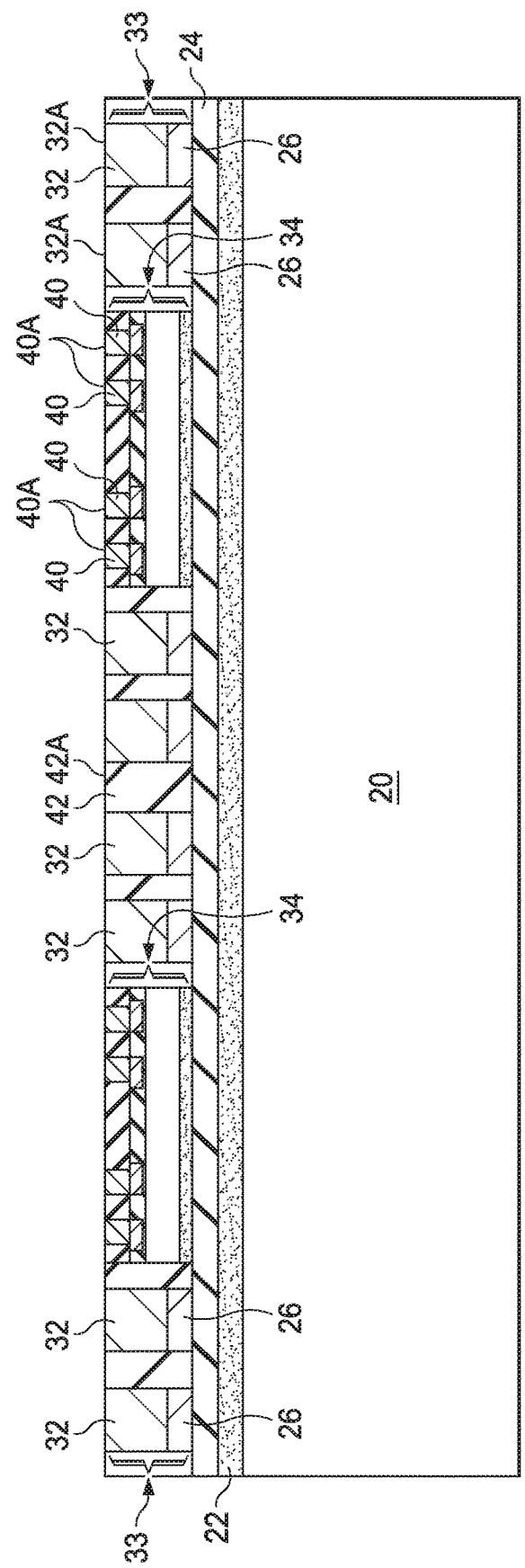

Next, a grinding step is performed to thin molding material 42, until metal pillars 40 and TIVs 33 are exposed. The resulting structure is shown in FIG. 9. Due to the grinding, the top ends 32A of metal features 32 are substantially level (coplanar) with the top ends 40A of metal pillars 40, and are substantially level (coplanar) with top surface 42A of molding material 42. As a result of the grinding, metal residues such as metal particles may be generated, and left on the top surfaces 32A, 40A, and 42A. Accordingly, after the grinding, a cleaning may be performed, for example, through a wet etching, so that the metal residue is removed.

Figure 10:
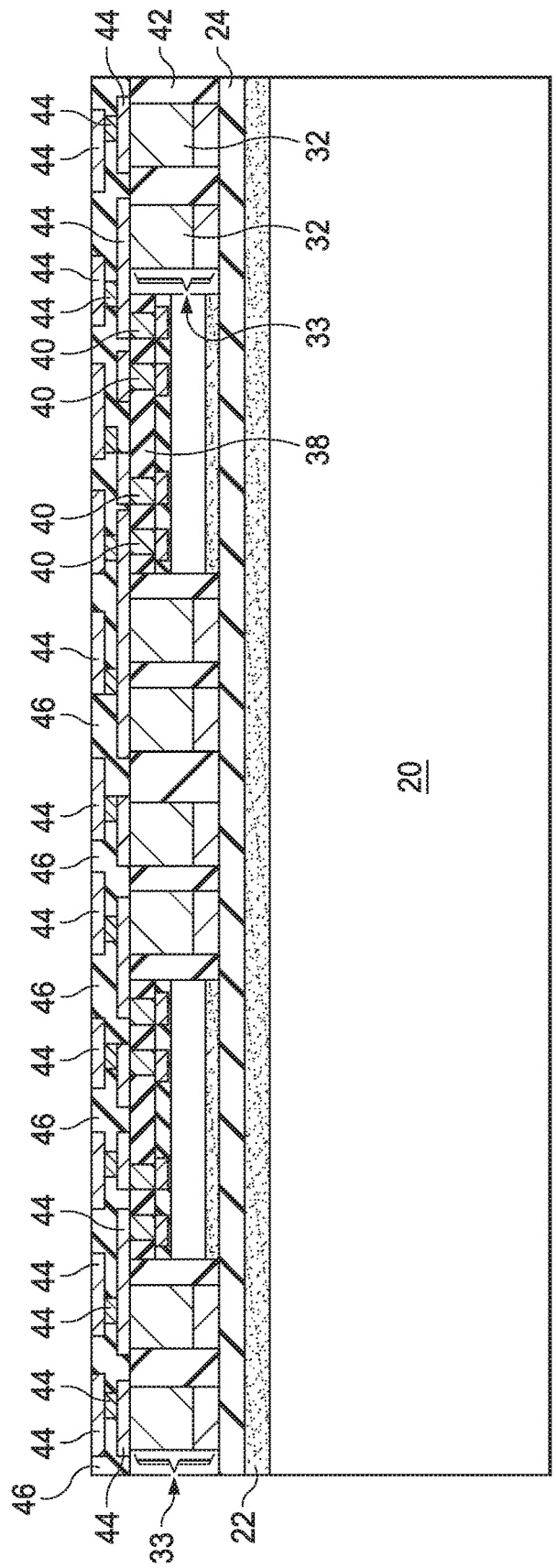

Next, referring to FIG. 10, Redistribution Lines (RDLs) 44 are formed over molding material 42 to connect to metal pillars 40 and TIVs 33. RDLs 44 may also interconnect metal pillars 40 and TIVs 33. In accordance with various embodiments, one or a plurality of dielectric layers 46 are formed over the structure shown in FIG. 9, with RDLs 44 formed in dielectric layers 46. In some embodiments, the formation of one layer of RDLs 44 and dielectric layers 46 includes forming a blanket copper seed layer, forming and patterning a mask layer over the blanket copper seed layer, performing a plating to form RDLs 44, removing the mask layer, and performing a flash etching to remove the portions of the blanket copper seed layer not covered by RDLs 44. In alternative embodiments, RDLs 44 are formed by depositing metal layers, patterning the metal layers, and fill the gaps between RDLs 44 with dielectric layers 46. RDLs 44 may comprise a metal or a metal alloy including aluminum, copper, tungsten, and/or alloys thereof. FIG. 10 illustrates two layers of RDLs 44, while there may be one or more than two layers of RDLs, depending on the routing requirement of the respective package. Dielectric layers 46 in these embodiments may comprise a polymer such as polyimide, benzocyclobutene (BCB), polybenzoxazole (PBO), or the like. Alternatively, dielectric layers 46 may include non-organic dielectric materials such as silicon oxide, silicon nitride, silicon carbide, silicon oxynitride, or the like.

Figure 11:
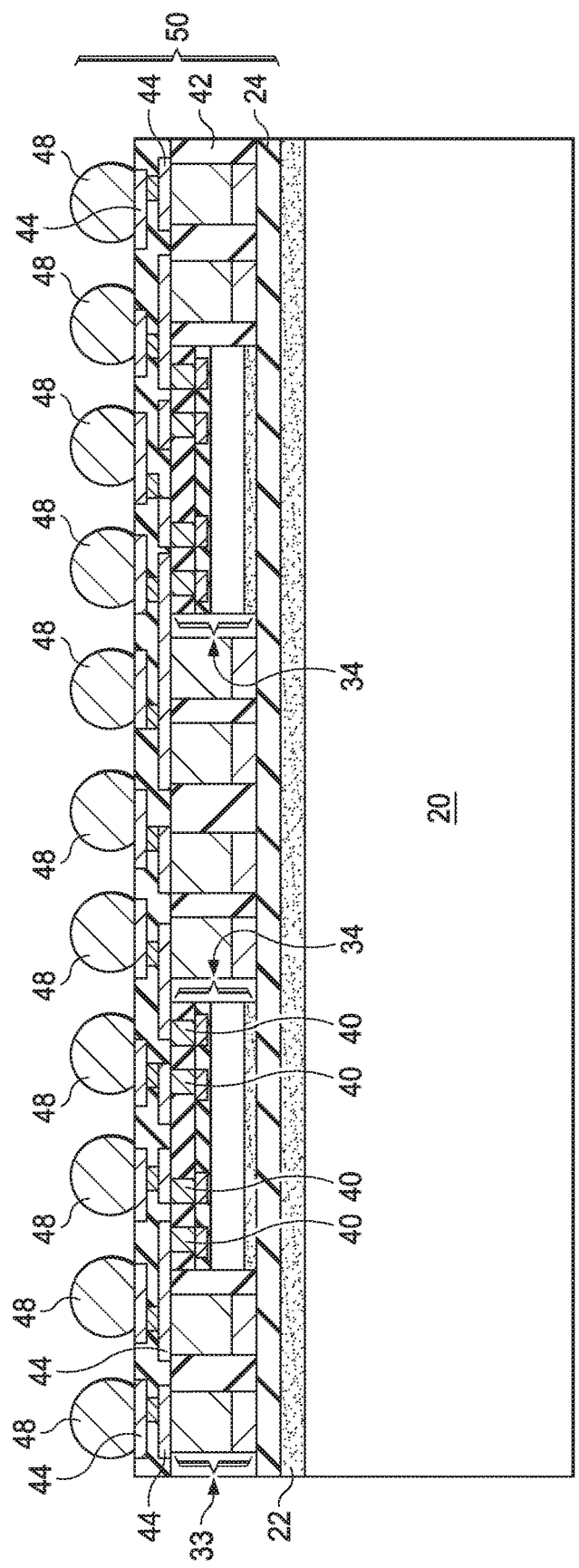

FIG. 11 illustrates the formation of electrical connectors 48 in accordance with some exemplary embodiments. The formation of electrical connectors 48 may include placing solder balls on the exposed portions of RDLs 44 (or Under-Bump Metallurgies (if formed, not shown)), and then reflowing the solder balls. In alternative embodiments, the formation of electrical connectors 48 includes performing a plating step to form solder regions over RDLs 44, and then reflowing the solder regions. Electrical connectors 48 may also include metal pillars, or metal pillars and solder caps, which may also be formed through plating. Throughout the description, the combined structure including device dies 34, TIVs 33, molding material 42, the overlying RDLs 44 and dielectric layers 46, and buffer layer 24 is referred to as TIV package 50, which may be a composite wafer.

Next, TIV package 50 is de-bonded from carrier 20. Adhesive layer 22 is also cleaned from TIV package 50. The resulting structure is shown in FIG. 12. As a result of the removal of adhesive layer 22, buffer layer 24 is exposed. TIV package 50 is further adhered to a dicing tape 52, wherein electrical connectors 48 face toward, and may contact, dicing tape 52. In some embodiments, laminating film 54 is placed onto the exposed buffer layer 24, wherein laminating film 54 may comprises SR, ABF, backside coating tape, or the like. In alternative film, no laminating film 54 is placed over buffer layer 24.

FIG. 13 illustrates the opening of buffer layer 24 and laminating film 54 (if any). Openings 56 and guiding trenches 58 are formed in buffer layer 24 and laminating film 54. In accordance with some embodiments, openings 56 and guiding trenches 58 are formed through laser drill, although photolithography processes may also be used. TIVs 33 are exposed through openings 56. In the embodiments wherein seed layer 26 (FIG. 1) includes titanium portion 26A, an etch step is performed to remove titanium portion 26A, so that the copper portion 26B of seed layer 26 is exposed. Otherwise, if seed layer 26 does not include titanium, the etch step is skipped.

Figure 14A:
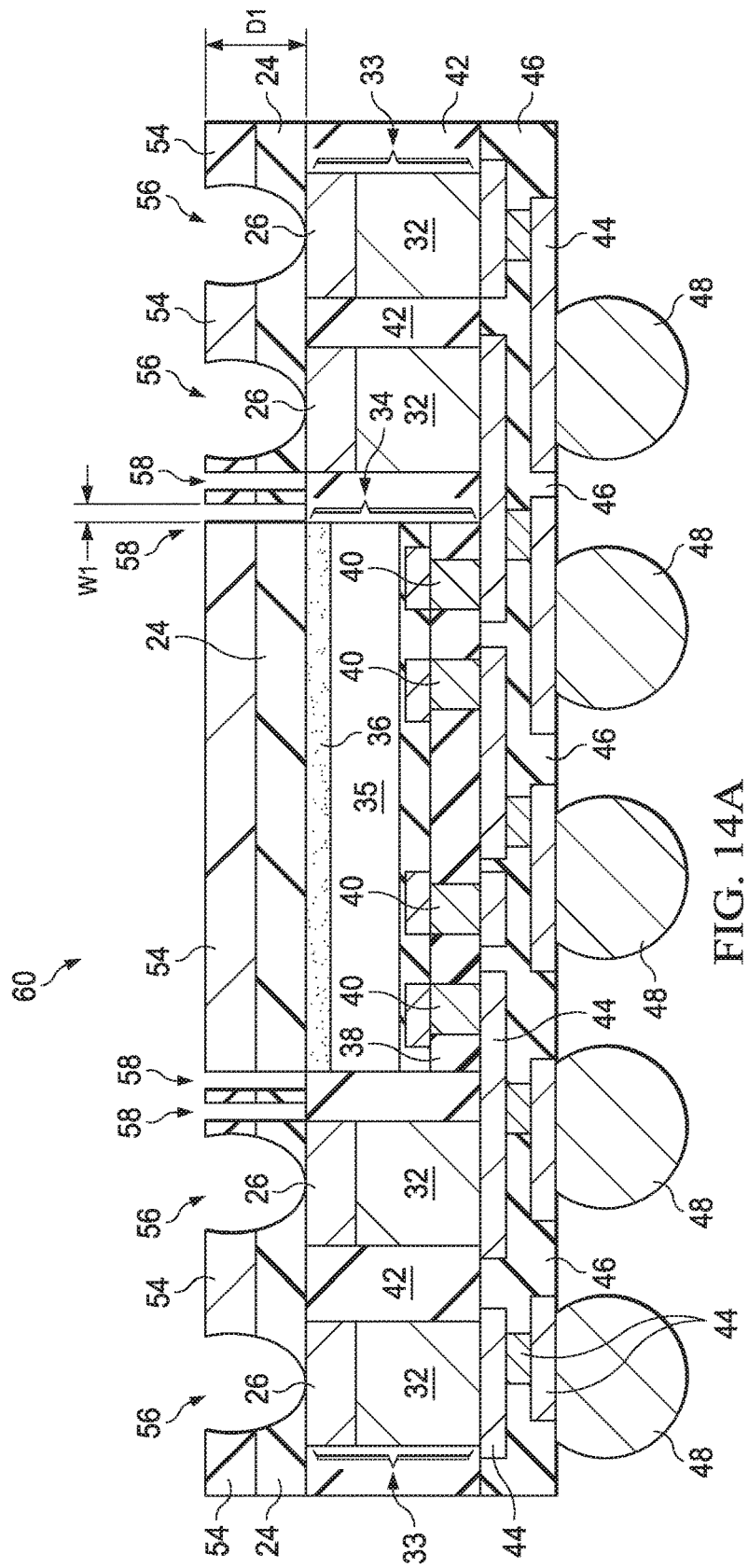
FIGS. 14A and 14B illustrate a cross-sectional view and a top view, respectively, of a TIV package in accordance with some exemplary embodiments.
Figure 14B:
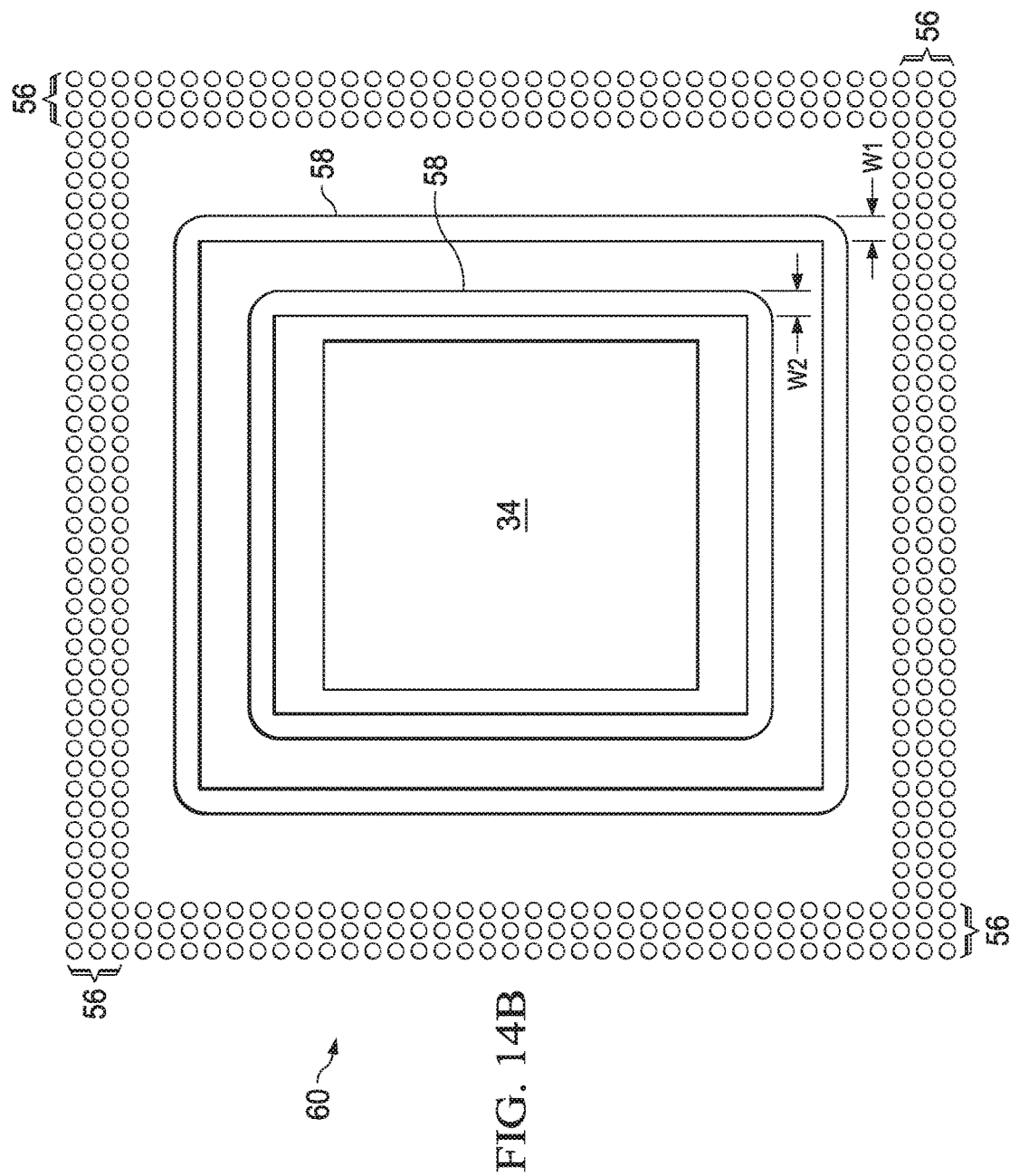

Guiding trenches 58 are also formed in buffer layer 24 and laminating film 54. In some embodiments, guiding trenches 58 are formed as rings, as illustrated in FIG. 14B. Accordingly, guiding trenches 58 are alternatively referred to as guiding trench rings 58, although they may also be formed as discrete guiding trench stripes or partial rings. As shown in FIG. 13, in some embodiments, each of guiding trenches 58 encircles a center portion of buffer layer 24 that overlaps the entire device die 34, with guiding trenches 58 misaligned with device die 34. Alternatively stated, guiding trenches 58 do not extend into the regions directly overlying device dies 34. The bottoms of guiding trenches 58 may be substantially level with the top surface 42A of molding material 42, and hence guiding trenches 58 penetrate through buffer layer 24 and laminating film 54. In alternative embodiments, guiding trenches 58 do not penetrate through buffer layer 24, and a lower part of buffer layer 24 remains underlying guiding trenches 58. In yet alternative embodiments, guiding trenches 58 penetrate through buffer layer 24, and extend into molding material 42.

Next, TIV package 50 is sawed into a plurality of TIV packages 60. FIGS. 14A and 14B illustrate a top view and a cross-sectional view, respectively, of one of TIV packages 60. In some embodiments, a solder paste (not shown) is applied to protect the exposed TIVs 33. In alternative embodiments, no solder paste is applied. As shown in FIG. 14B, in the top view, guiding trench rings 58 encircle device die 34. Although the inner edges of guiding trench rings 58 are shown as being off-set from the respective edges of device die 34, the inner edges of guiding trench rings 58 may also be aligned to the edges of the respective device die 34. In some embodiments, there is a single guiding trench ring 58 in each TIV package 60. In alternative embodiments, there are two or more guiding trench rings 58. The width W1 and W2 of guiding trench rings 58 may be greater than about 60 μm, and may be between about 60 μm and about 250 μm. The depth D1 (FIG. 14A) of guiding trench rings 58 may be greater than about 2 μm, and may be between about 2 μm and about 50 μm.

Figure 15:
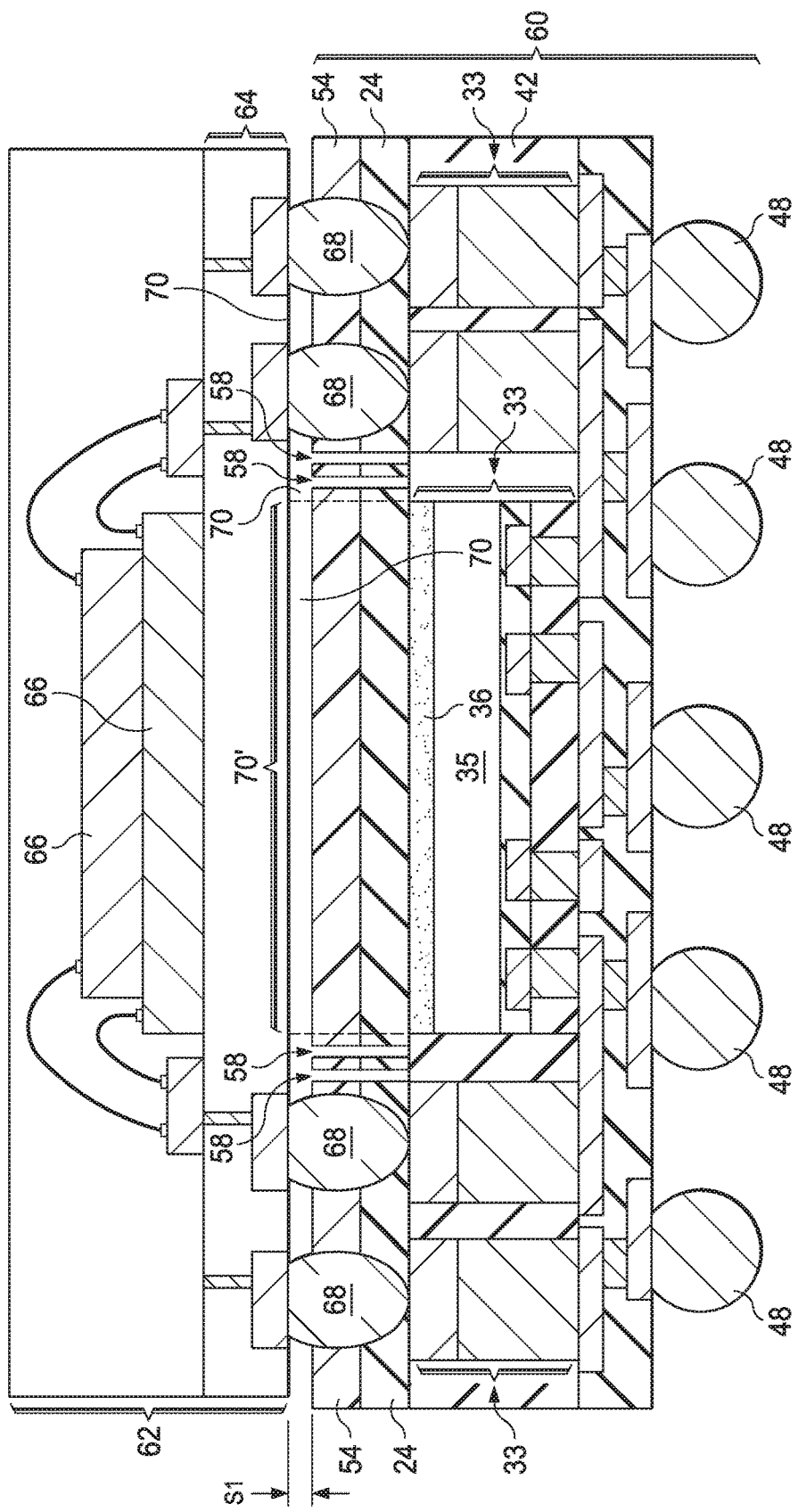
FIG. 15 illustrates the bonding of a TIV package with a top package.

FIG. 15 illustrates the bonding of top package 62 to TIV package 60, wherein the bonding may be through solder regions 68. Throughout the description, TIV packages 60 are also referred to as bottom package 60 since they may act as the bottom packages, as shown in FIG. 15. In some embodiments, top package 62 includes device dies 66 bonded to package substrate 64. Device dies 66 may include a memory die(s), which may be, for example, a Static Random Access Memory (SRAM) die, a Dynamic Random Access Memory (DRAM) die, or the like. The bottom surface of top package 62 and the top surface of TIV package 60 are spaced apart from each other by gap 70, wherein top package 62 and TIV package 60 may have standoff distance S1, which may be between about 10 μm and about 100 μm, although standoff distance S1 may have other values.

Referring to FIG. 16, the bonded top package 62 and TIV package 60 are further bonded to another package component 72, which may be a package substrate in some embodiments. In alternative embodiments, package component 72 comprises a Printed Circuit Board (PCB). Package component 72 may have electrical connectors 76 (such as metal pads or metal pillars) on opposite sides, and metal traces 78 interconnecting the electrical connectors 76.

In some embodiments, underfill 74 is dispensed to fill gap 70 (FIG. 15). Underfill 74 may also seal the perimeter part of gap 70, while a center part 70' of gap 70 is not filled by underfill 74. In the dispensing of underfill 74, underfill 74 flows into gap 70 and guiding trenches 58 (FIG. 15). Since guiding trenches 58 are deeper than the center portion 70' of gap 70, underfill 74 will flow faster in guiding trenches 58 than in center gap portion 70'. Accordingly, underfill 74 will fill guiding trenches 58 first before it can flow into center portion 70', which overlaps device die 34. By ending the underfilling process at an appropriate time, underfill 74 is filled into guiding trenches 58, but does not enter center gap portion 70'. Underfill 74 thus may encircle, and does not fill into, the center gap portion 70'. Center gap portion 70' thus remains to be an empty space, which may be an air gap filled with air or a vacuumed empty space.

In the embodiments of the present disclosure, the TIV package and the overlying top package are separated from each other by an empty space, which may be an air gap or a vacuumed empty space or a vacuumed empty space. Since the heat-insulating ability of the empty space is better than that of underfill, the empty space has better ability for preventing the heat in the device die in the TIV package from being conducted to, and affecting the operation of, the dies in the top package. It is appreciated that if the guiding trenches are not formed, the distances that the underfill fills into the gap between the TIV package and the top package is random, and hence the formation of the empty spaces would have been non-uniform. Through the formation of the guiding trenches in the buffer layer, the formation of the empty space is more controllable, and is more uniform.

In accordance with some embodiments, a bottom package includes a molding compound, a buffer layer over and contacting the molding compound, and a through-via penetrating through the molding compound. A device die is molded in the molding compound. A guiding trench extends from a top surface of the buffer layer into the buffer layer, wherein the guiding trench is misaligned with the device die.

In accordance with other embodiments, a package includes a bottom package, and a top package bonded to the bottom package. The bottom package includes a molding compound having a planar top surface and a planar bottom surface, a device die molded in the molding compound, a planar dielectric layer over and contacting the planar top surface of the molding compound, a through-via penetrating through the molding compound, and a first guiding trench ring in the planar dielectric layer. The top package is spaced apart from the bottom package by a gap, wherein the first guiding trench ring is connected to the gap. An underfill fills a perimeter of the gap and at least a portion of the first guiding trench ring, wherein a center portion of the gap is encircled by the underfill, and wherein the center portion forms an empty space.

In accordance with yet other embodiments, a method includes forming a through-via over a dielectric buffer layer, placing a device die over the dielectric buffer layer, molding the device die and the through-via in a molding compound, and planarizing the molding compound to expose the through-via and a metal pillar of the device die. Redistribution lines are formed overlying and electrically coupled to the through-via and the metal pillar. Openings are formed in the dielectric buffer layer to expose the through-via. A guiding trench ring is formed in the dielectric buffer layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
    an encapsulating material;
    a dielectric layer over the encapsulating material, with a first guiding trench extending from a top surface to a bottom surface of the dielectric layer, wherein the first guiding trench forms a full ring encircling a portion of the dielectric layer; and
    a device die encapsulated in the encapsulating material and underlying the dielectric layer.

2. The package of claim 1, wherein the first guiding trench extends to a top surface of the encapsulating material.

3. The package of claim 1, wherein the first guiding trench encircles a portion of the dielectric layer, and the portion of the dielectric layer overlaps an entirety of the device die.

4. The package of claim 1 further comprising a second guiding trench penetrating through the dielectric layer, wherein the second guiding trench encircles the first guiding trench.

5. The package of claim 1 further comprising a plurality of solder regions extending into the dielectric layer, wherein the plurality of solder regions are aligned into an additional ring, and the additional ring encircles the first guiding trench.

6. The package of claim 1 further comprising a conductive through-via penetrating through the encapsulating material.

7. The package of claim 1, wherein the encapsulating material, the dielectric layer, and the device die are parts of a first package, and the package further comprises:
    a second package over the first package;
    a plurality of solder regions bonding the first package to the second package; and
    an underfill in a gap between the first package and the second package, wherein the underfill comprises a portion filling the first guiding trench.

8. The package of claim 7, wherein the underfill seals an air gap therein, and the air gap overlaps the device die.

9. The package of claim 8, wherein the air gap has a bottom corner joining a top corner of the first guiding trench.

10. A package comprising:
    a first package comprising:
        a molding compound comprising a top surface and a bottom surface;
        a device die molded in the molding compound;
        at least one dielectric layer over and contacting the top surface of the molding compound, wherein the at least one dielectric layer comprises a portion overlapping the device die;
        a through-via penetrating through the molding compound;
    a second package over and bonded to the first package; and
    an encapsulant comprising a first portion between the first package and the second package, wherein the first portion of the encapsulant further comprises a ring portion penetrating through the at least one dielectric layer, with the ring portion of the encapsulant contacting the molding compound to form an interface, and the interface forms a ring.

11. The package of claim 10, wherein the encapsulant further comprises a second portion at a same level as, and encircling, the first package.

12. The package of claim 10, wherein the ring portion encircles a portion of the at least one dielectric layer, and the portion of the at least one dielectric layer overlaps an entirety of the device die.

13. The package of claim 10, wherein the encapsulant encircles an air gap therein, with the air gap between the first package and the second package.

14. The package of claim 10 further comprising a plurality of solder regions bonding the first package to the second package, wherein the ring portion of the encapsulant is encircled by the plurality of solder regions.

15. The package of claim 10, wherein the encapsulant further comprises an additional ring portion penetrating through the at least one dielectric layer, wherein the additional ring portion encircles the ring portion of the encapsulant.

16. A package comprising:
    a first package comprising:
        a device die;
        a package component bonded with the device die;
        electrical connectors on a side of the package component; and
    an encapsulant comprising:
        a first portion contacting the package component, with the electrical connectors penetrating through the first portion; and
        a second portion protruding beyond the first portion and at a same level as the electrical connectors, wherein the package component and the second portion of the encapsulant are on opposite sides of the first portion of the encapsulant, and the second portion of the encapsulant forms a ring.

17. The package of claim 16, wherein the first portion and the second portion are formed of a same dielectric material, with no distinguishable interface between the first portion and the second portion of the encapsulant.

18. The package of claim 16 further comprising at least one dielectric layer, with the second portion of the encapsulant penetrating through the at least one dielectric layer.

19. The package of claim 16 further comprising a second package bonded to the first package, wherein the first portion of the encapsulant is between the first package and the second package.

20. The package of claim 19, wherein the second package further comprises:
    a device die; and
    a molding compound encapsulating the device die therein, wherein the second portion of the encapsulant contacts the molding compound.

* * * * *